United States Patent
Hoshi (10) Patent No.: US 6,383,853 B2
(45) Date of Patent: May 7, 2002

(54) METHOD OF FABRICATING SEMICONDUCTOR DEVICE

(75) Inventor: Shinichi Hoshi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/799,049

(22) Filed: Mar. 6, 2001

(30) Foreign Application Priority Data

Jul. 5, 2000 (JP) ........................ 2000-203694

(51) Int. Cl.$^7$ ............................ H01L 21/338
(52) U.S. Cl. ............................ 438/167
(58) Field of Search ............. 438/257, 259, 438/270, 587, 589, 717, 167, 666, 667, 668, 67, 671, 674, 688

(56) References Cited

U.S. PATENT DOCUMENTS

| | | | |
|---|---|---|---|
| 4,551,905 A | * 11/1985 | Chao et al. | ........ 29/571 |
| 4,618,510 A | * 10/1986 | Tan | ........ 427/89 |
| 5,126,288 A | * 6/1992 | Nakagawa | ........ 437/228 |
| 5,401,530 A | * 3/1995 | Tamura et al. | ........ 427/63 |
| 5,776,836 A | * 7/1998 | Sandhu | ........ 438/717 |
| 6,211,073 B1 | * 4/2001 | Ahn et al. | ........ 438/653 |

OTHER PUBLICATIONS

IEEE Transactions On Electron Devices, vol. 45, No. 8, Aug. 1998, pp. 1559–1660.
Ralph E. Williams, Artech House, pp. 270–284.

* cited by examiner

Primary Examiner—David Nelms
Assistant Examiner—Quoc Hoang
(74) Attorney, Agent, or Firm—Volentine Francos, PLLC (57) ABSTRACT

A method of fabricating a semiconductor device, capable of forming a pattern more finely and more variously without depending on the performance of an exposing device. Aluminum is vapor deposited on a spacer film from an oblique direction to form a metal film etching guard. Specifically, Al is vapor deposited from a direction inclined from the direction of the normal line of the surface of the spacer film by 85° (angle of vapor deposition). For example, when the depth of a recess is 0.10 μm and the opening width is 0.4 μm, Al is not vapor deposited on the bottom surface of the recess. After performing anisotropic etching on the spacer film by using the metal film etching guard as a mask, the metal film etching guard is removed. A gate electrode is formed in the recess.

11 Claims, 13 Drawing Sheets

METHOD OF FABRICATING SEMICONDUCTOR DEVICE

BACKGROUND OF THE INVENTION

1. Field of the Invention

The present invention relates to a method of fabricating a semiconductor device.

2. Description of the Related Art

A conventional method of fabricating an MESFET (MEtal Semiconductor Field Effect Transistor) is disclosed in III-C Device Fabrication in P1659 and in FIG. 9 in P1660 of the following Document 1.

Document 1: IEEE TRANSACTIONS ON ELECTRON DEVICES, VOL. 45, NO. 8, AUGUST 1998, "0.2 $\mu$m Fully-Self-Aligned Y-Shaped Gate HJFET's with Reduced Gate-Fringing Capacitance Fabricated Using Collimated Sputtering and Electroless Au-Plating", P1559 to P1660 (FIG. 9)

In Document 1, a technique related to a self-aligning method for forming $SiO_2$ side walls by using side faces of an $SiO_2$ insulating film and forming a gate electrode by using the side walls as a mask is described.

The technique is characterized in that the distance between an $n^+$ cap layer and a gate electrode is adjusted by a side etching amount at the time of etching the $n^+$ cap layer.

Common processing techniques related to gate formation are, except for the self aligning method, a lift-off method using a photoresist and an etching method using a dummy gate which are disclosed in the following Document 2.

Document 2: Ralph E. Williams, ARTECH HOUSE, "Gallium Arsenide Processing Technique", P270 to P284, Chapter 12-3 GATE FABRICATION The method of fabricating a semiconductor device described in Document 1 has, however, the following problems.

1. Since the side etching amount of the $n^+$ cap layer (hereinbelow, called "$n^+$ layer") fluctuates according to etching conditions, the state of the $n^+$ layer, and the like, it is extremely difficult to adjust the distance between the $n^+$ layer and the gate electrode to a predetermined value.

2. Since the side faces of the $n^+$ layer are exposed, it is feared that the gate electrode and the $n^+$ layer are in contact with each other. The problem can occur due to a deviation (migration) of a vapor deposition position at the time of forming the gate electrode and wafer in-plane dependency of an incident angle of vapor deposition of a metal for forming the gate electrode.

3. Since Lsg (distance between the $n^+$ layer on the source electrode side and the gate electrode) and Lgd (distance between the gate electrode and the $n^+$ layer on the source electrode side) become equal to each other, an asymmetrical FET cannot be manufactured. The asymmetrical FET is used, for example, in the case where the source resistance is desired to be reduced or in the case where the withstand voltage between the gate and drain is desired to be improved.

On the other hand, like the method of fabricating a semiconductor device described in Document 2, in the case of forming a gate by patterning a resist, the minimum values of Lsg, Lgd, and Lg (gate length) are determined by the performances (especially, resolution) of an exposing device. In the case of increasing the packing density of a semiconductor device by making the pattern finer, a higher performance exposing device is required and it causes a rise in fabrication cost.

SUMMARY OF THE INVENTION

The invention has been achieved by considering the problems as described above and its object is to provide a method of fabricating a semiconductor device, capable of forming a pattern more finely and more variously without depending on the performance of an exposing device. It is another object of the invention to provide a method of fabricating a semiconductor device, capable of adjusting the distance between patterns with high accuracy while preventing short-circuiting between the patterns.

In order to achieve the objects, according to a first aspect of the invention, there is provided a method of fabricating a semiconductor device, including: a step of forming a first layer on a substrate; a step of forming a second layer on the first layer; a step of forming a recess from which the first layer is exposed by removing a part of the second layer; a step of forming an insulating film covering the surface of the second layer, and an inner wall face and a bottom face of the recess; a step of forming a mask (film for etching guard) by depositing a material different from the material of the insulating film onto the insulating film from a direction which forms a predetermined angle with a direction of a normal line of the surface of the insulating film; a step of performing anisotropic etching on the insulating film exposed from the mask from the direction of the normal line of the surface of the mask; a step of removing the mask; and a step of filling the recess with a metal material.

According to the fabricating method, in the bottom face of the recess, a region in which a mask is not formed and from which the insulating film is exposed is obtained. Only the insulating film in the exposed region is removed by anisotropic etching. Since the recess is filled with a metal material, the metal material and the first layer are electrically connected to each other, and the metal material and the second layer are electrically completely insulated from each other by the insulating film.

When an opening width and a depth of the recess after the insulating film is formed are W and D, respectively, the predetermined angle in the step of forming the mask is preferably adjusted to a value larger than a obtained from the following equation.

$$\alpha = \tan^{-1}(W/D)$$

By adjusting the angle of deposition in such a manner, the depositing material does not reach the bottom face of the recess at the time of forming the mask. As a result, the mask is not formed on the entire bottom face of the recess and the insulating film is exposed.

When an opening width and a depth of the recess after the insulating film is formed are W and D, respectively, the predetermined angle in the step of forming the mask may be adjusted to a value smaller than $\alpha$ obtained from the following equation and larger than zero.

$$\alpha = \tan^{-1}(W/D)$$

By adjusting the angle of deposition in such a manner, the depositing material does not reach a part of the bottom face of the recess at the time of forming the mask. As a result, a region in which the mask is not formed and from which the insulating film is exposed is obtained in the bottom face of the recess. The insulating film exposed in the recess is removed by anisotropic etching. By filling the recess with a metal material, the metal material and the first layer are connected to each other. In such a manner, a circuit pattern connecting the metal material and the first layer is made finer in accordance with the size of the exposed range of the insulating film in the recess, that is, the range in which the mask is not formed. The range in which the mask is not formed is enlarged or reduced by adjusting the angle of deposition. By properly adjusting the angle of deposition, the finer circuit pattern is therefore realized.

According to a second aspect of the invention, there is provided a method of fabricating a semiconductor device, comprising: a step of forming a first layer on a substrate; a step of forming a second layer on the first layer; a step of forming a first recess and a second recess from which the first layer is exposed by removing a part and another part of the second layer; a step of forming an insulating film covering the surface of the second layer, and an inner wall face and a bottom face of each of the first recess and the second recess; a step of forming a first mask on the insulating film positioned between the first recess and the second recess; a step of forming a second mask by depositing a material different from the material of the insulating film onto the insulating film and the first mask from a first direction which forms a predetermined first angle with a direction of a normal line of the surface of the insulating film; a step of forming a third mask by depositing a material different from the material of the insulating film onto the insulating film and the first mask from a second direction which forms a predetermined second angle with a direction of a normal line of the surface of the insulating film; a step of performing anisotropic etching on the insulating film exposed from the second mask and the third mask from directions of the normal lines of the surfaces of the second and third masks; a step of removing the first, second, and third masks; and a step of filling the first and second recesses with a metal material.

According to the fabricating method, at the time of forming the second mask (first film for etching guard) and at the time of forming the third mask (second film for etching guard), the depositing material can be shielded by the first mask (film for guarding depositing material) so as not to deposit the depositing material in a predetermined range. For example, at the time of forming the second mask, the depositing material is allowed to reach a part of the bottom face of the first recess but is not allowed to enter the second recess. At the time of forming the third mask, the depositing material is allowed to reach a part of the bottom face of the second recess but is not allowed to enter the first recess. By properly adjusting the angle of deposition at the time of forming the second mask and the angle of deposition at the time of forming the third mask, an independent circuit pattern can be formed in each of the first and second recesses.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Preferred embodiments of a method of fabricating a semiconductor device according to the invention will be described in detail hereinbelow with reference to the appended drawings. In the following description and the attended drawings, elements having substantially the same function and configuration are designated by the same reference numeral, thereby avoiding repetitive description.
First Embodiment A method of fabricating an MESFET as a semiconductor device according to a first embodiment of the invention will be described with reference to FIGS. 1 to 8.

Figure 1:
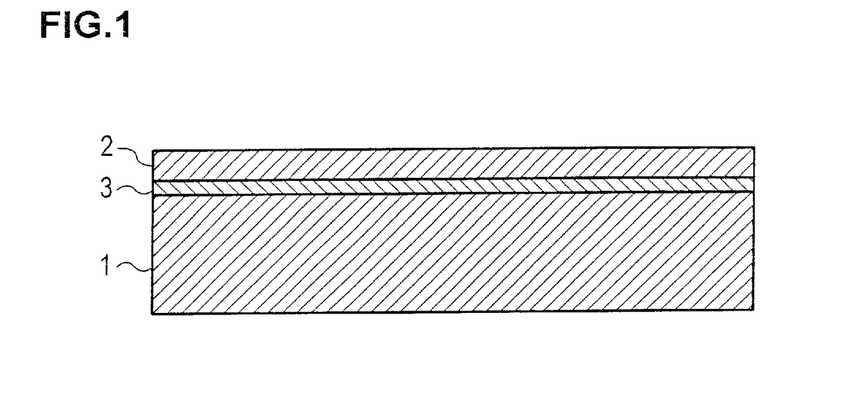
FIG. 1 is a cross section (No. 1) showing a method of fabricating a semiconductor device according to a first embodiment of the invention.

A channel layer 3 as a first layer is formed on the surface of an epitaxial substrate (hereinbelow, called a "substrate") 1, and an n$^+$ layer 2 (GaAs, thickness of 0.20 $\mu$m) as a second layer is formed on the surface of the channel layer 3 (FIG. 1).

Figure 2:
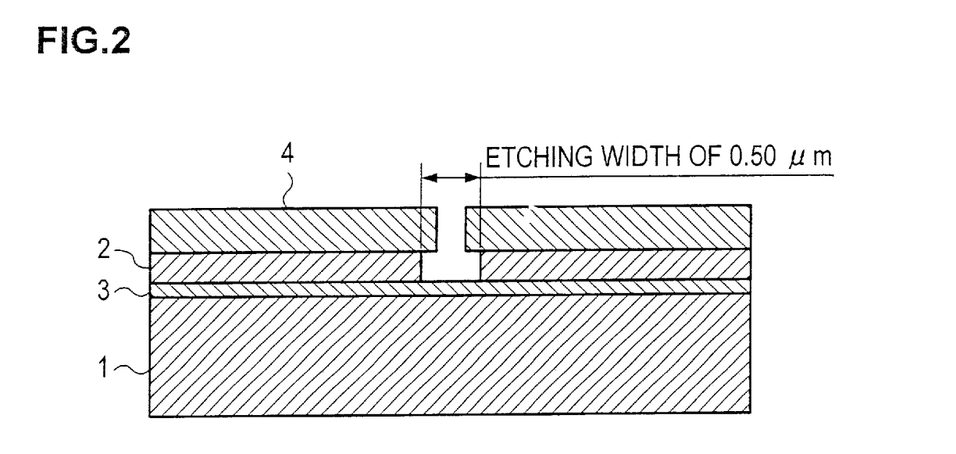
FIG. 2 is a cross section (No. 2) showing the method of fabricating a semiconductor device according to the first embodiment of the invention.

A photoresist is applied on the surface of the n$^+$ layer 2, thereby forming a photoresist film 4. The photoresist film 4 is exposed and removed in a predetermined pattern and, after that, the n$^+$ layer 2 is etched by using, for example, a phosphate aqueous solution to expose a part of the surface of the channel layer 3 (FIG. 2). In the following, the fabricating method in the case where the etching width (outer recess width) is 0.50 $\mu$m will be described.

Figure 3:
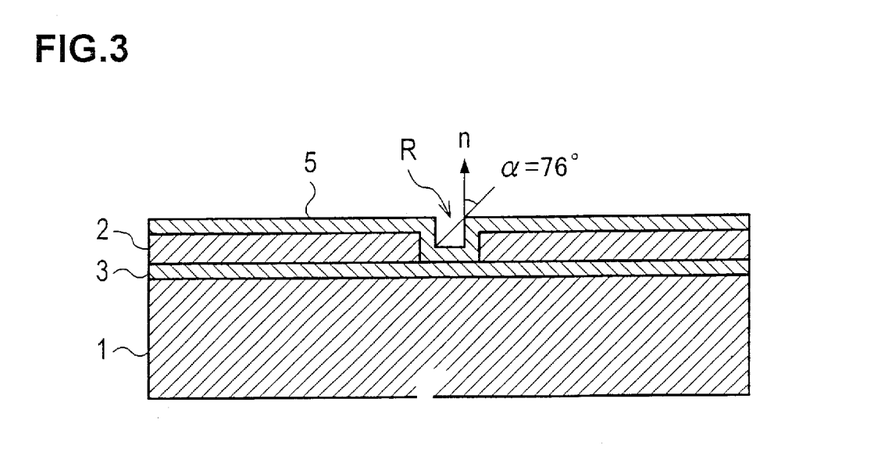
FIG. 3 is a cross section (No. 3) showing the method of fabricating a semiconductor device according to the first embodiment of the invention.

The photoresist film 4 is removed. An SiO$_2$ spacer film 5 (SiO$_2$, thickness of 0.10 $\mu$m) as an insulating film is formed by using CVD (FIG. 3). Not only the surface (top face) of the n$^+$ layer 2 but also the side faces of n$^+$ in a space (recess) obtained by etching the n$^+$ layer 2, and the exposed surface of the channel layer 3 are covered with the spacer film 5.

Figure 4:
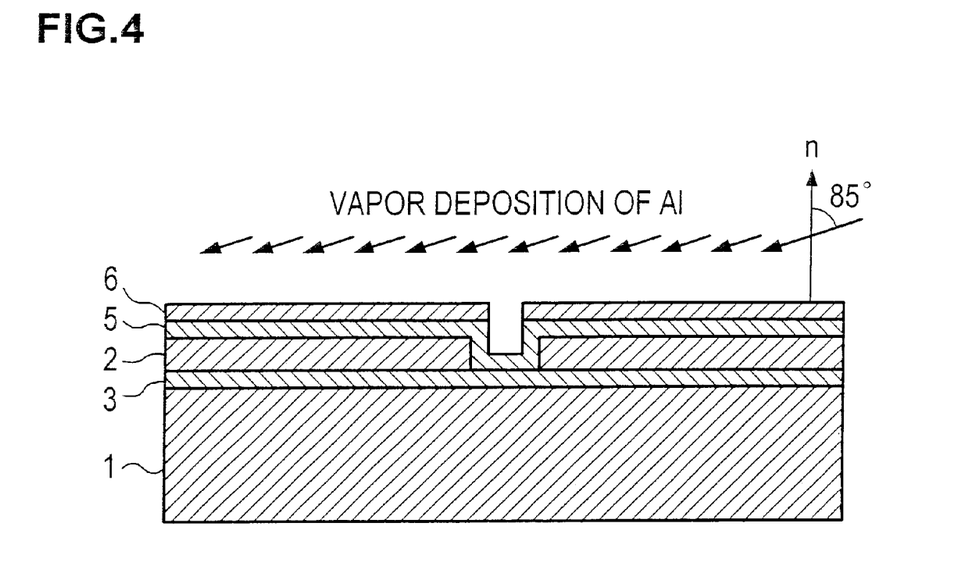
FIG. 4 is a cross section (No. 4) showing the method of fabricating a semiconductor device according to the first embodiment of the invention.

On the spacer film 5, a metal film 6 for etching guard is formed as a mask by obliquely vapor depositing Al (FIG. 4). The metal film 6 is a material different from the material of said insulating film. Specifically, Al is vapor deposited from the direction which is inclined from the direction of the normal line (n) of the surface of the SiO$_2$ spacer film 5 by 85° (vapor deposition angle)(the direction inclined from the surface of the spacer film 5 by 5°, the direction of arrows in the drawing).

The angle of vapor deposition of Al at this time is adjusted so that Al is not vapor deposited on the bottom face of the recess R. That is, when the width of the recess R after the spacer film 5 is formed is set as W and the depth is set as D, the angle of vapor deposition is adjusted to a value larger than $\alpha$ which is obtained by the following equation (refer to FIG. 3).

$$\alpha = \tan^{-1}(W/D)$$

In the embodiment, the depth D of the recess R is equal to the thickness of the n$^+$ layer 2. Consequently, the depth D is equal to 0.10 $\mu$m. Although the outer recess width is 0.50 $\mu$m, since the spacer film 5 is formed on the inner wall of the recess R, for example, the outer recess width W is narrowed to 0.4 $\mu$m. By substituting the values into the above equation, $\alpha$ is calculated as about 76°. That is, when the angle of vapor deposition is set to be larger than 76° (the angle of vapor deposition is adjusted to 85° in the embodiment), Al is not vapor deposited on the bottom face of the recess R.

Figure 5:
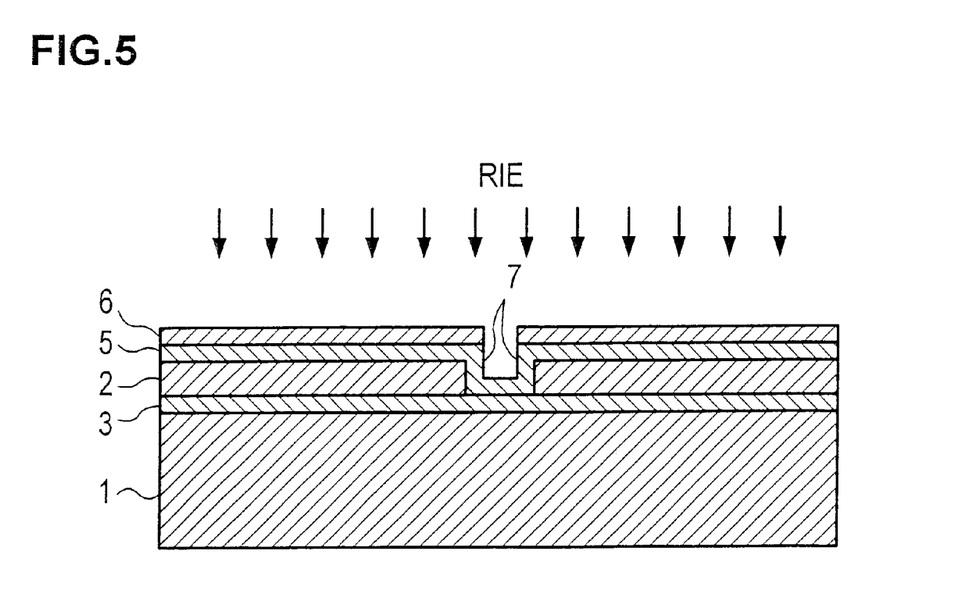
FIG. 5 is a cross section (No. 5) showing the method of fabricating a semiconductor device according to the first embodiment of the invention.

By using the metal film 6 for etching guard as a mask, anisotropic etching is performed on the spacer film 5. In this case, reactive ion etching (RIE, for example, with parameters of SF$_6$ gas, 10 mtorr, 100 W) is used as anisotropic etching. By the anisotropic etching, the spacer film 5 on the bottom of the recess R is removed and the channel layer 3 is exposed. Since the spacer film 5 covering the side faces of the n$^+$ layer 2 in the recess R is masked by the metal film 6 for etching guard, the spacer film 5 remains as side walls 7 (FIG. 5).

Figure 6:
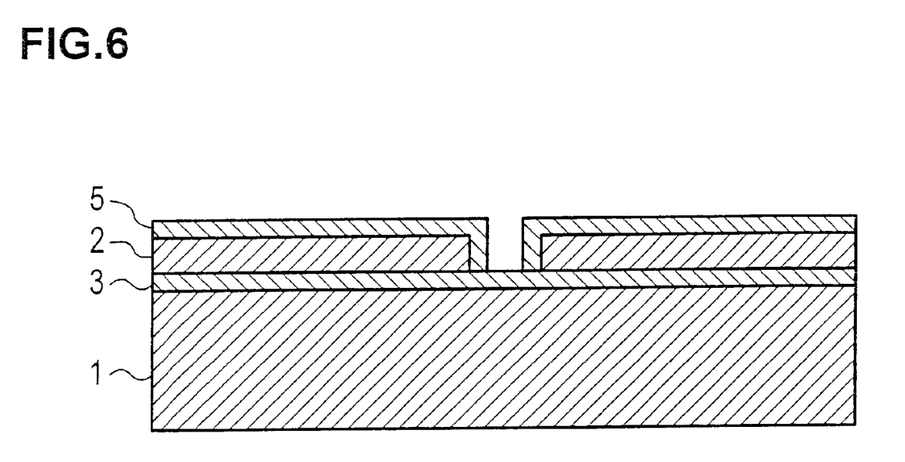
FIG. 6 is a cross section (No. 6) showing the method of fabricating a semiconductor device according to the first embodiment of the invention.

The metal film 6 for etching guard is removed by etching (FIG. 6). In this case, an etchant (for example, dilute hydrochloric acid) which reacts with Al and does not react with SiO$_2$ is used.

Figure 7:
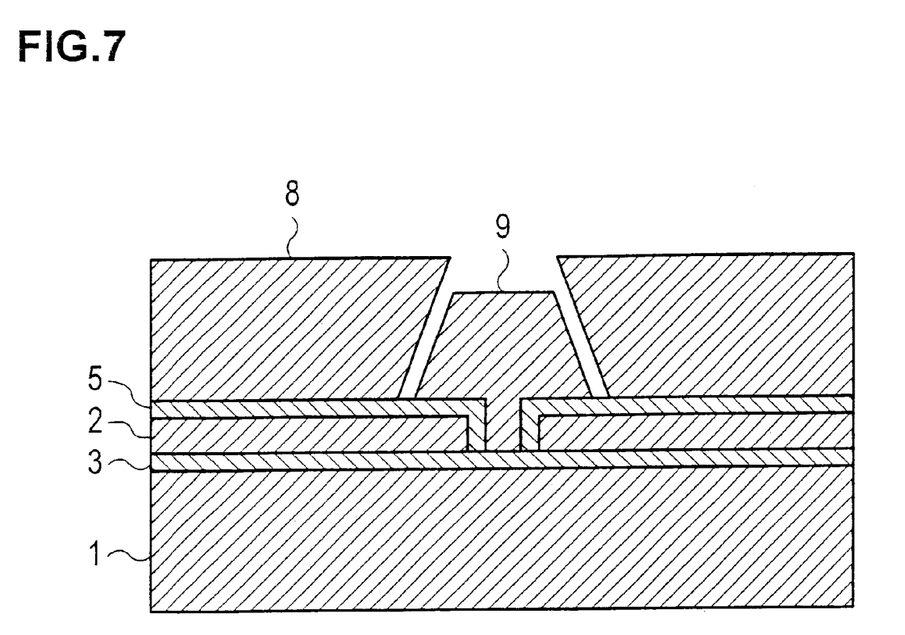
FIG. 7 is a cross section (No. 7) showing the method of fabricating a semiconductor device according to the first embodiment of the invention.

A lift-off resist is applied to form a lift-off resist film 8. The lift-off resist film 8 is patterned and an opening having an inverted taper shape is formed in a position corresponding to the recess R. By using the opening having an inverted taper shape, a gate electrode 9 is formed (FIG. 7).

Figure 8:
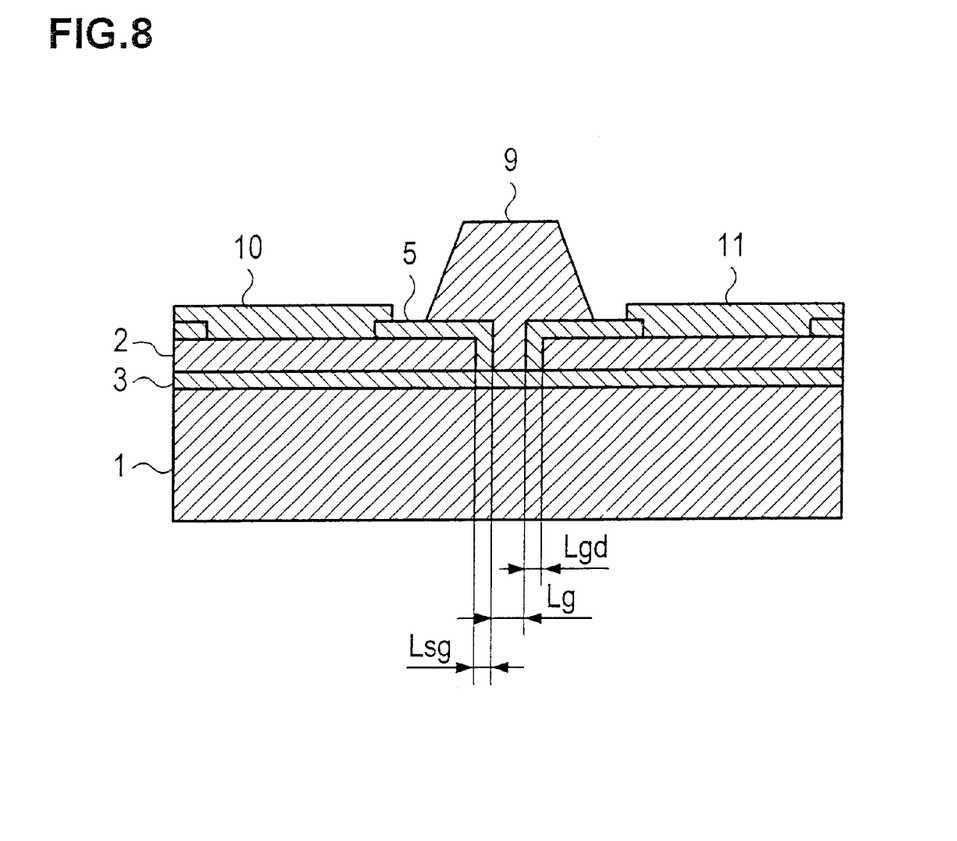
FIG. 8 is a cross section (No. 8) showing the method of fabricating a semiconductor device according to the first embodiment of the invention.

By removing predetermined two areas in the spacer film 5, the n$^+$ film 2 is exposed. Ohmic electrodes are formed in the exposed areas and are used as a source electrode 10 and a drain electrode 11 (FIG. 8).

Through the processes, a symmetrical self alignment gate MESFET is completed.

In the method of fabricating the semiconductor device according to the embodiment, the side faces of the n$^+$ layer 2 in the recess R are completely covered with the side walls 7. Thus, there is no possibility that the gate electrode 9 is in contact with the n$^+$ film 2.

In the method of fabricating the semiconductor device according to the embodiment, each of the distance Lsg between the source and the gate (distance between the n$^+$ layer 2 on the source side and the gate electrode 9) and the distance Lgd between the gate and the drain (distance between the gate electrode 9 and the n$^+$ layer 2 on the drain side) coincides with the width of the side wall 7. Since the width of the side wall 7 is adjusted by controlling the thickness of the spacer film 5, different from the conventional fabricating method, the distance Lsg between the source and the gate can be shortened without depending on the performance of the exposing device. For example, when the width of the side wall 7 is set to 0.07 $\mu$m, 0.07 $\mu$m is the value of the distance Lsg between the source and the gate (=distance Lgd between the gate and the drain).
Second Embodiment A method of fabricating an MESFET as a semiconductor device according to a second embodiment of the invention will be described by referring to FIGS. 9 to 16.

Figure 9:
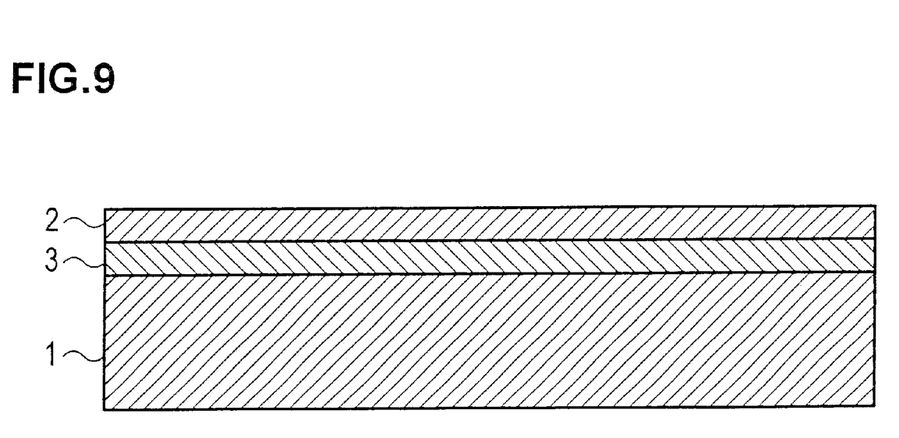
FIG. 9 is a cross section (No. 1) showing the method of fabricating a semiconductor device according to a second embodiment of the invention.

The channel layer 3 is formed on the surface of the substrate 1 and, further, the n$^+$ layer 2 (GaAs, thickness of 0.10 $\mu$m) is formed on the surface of the channel layer 3 (FIG. 9).

Figure 10:
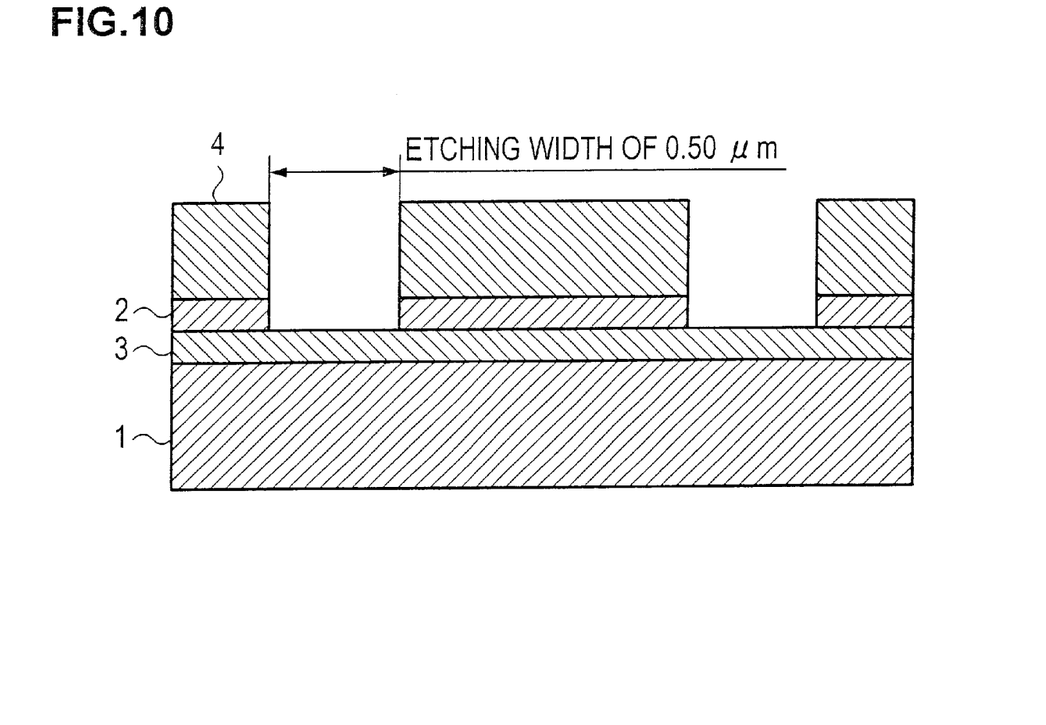
FIG. 10 is a cross section (No. 2) showing the method of fabricating a se conductor device according to the second embodiment of the invention.

A photoresist is applied on the surface of the n$^+$ layer 2, thereby forming the photoresist film 4. The photoresist film 4 is exposed and removed in a predetermined pattern and, after that, the n$^+$ layer 2 is etched by using, for example, a phosphate aqueous solution to expose a part of the surface of the channel layer 3 (FIG. 10). In the following, the fabricating method in the case where the etching width (outer recess width) is 0.50 $\mu$m will be described.

Figure 11:
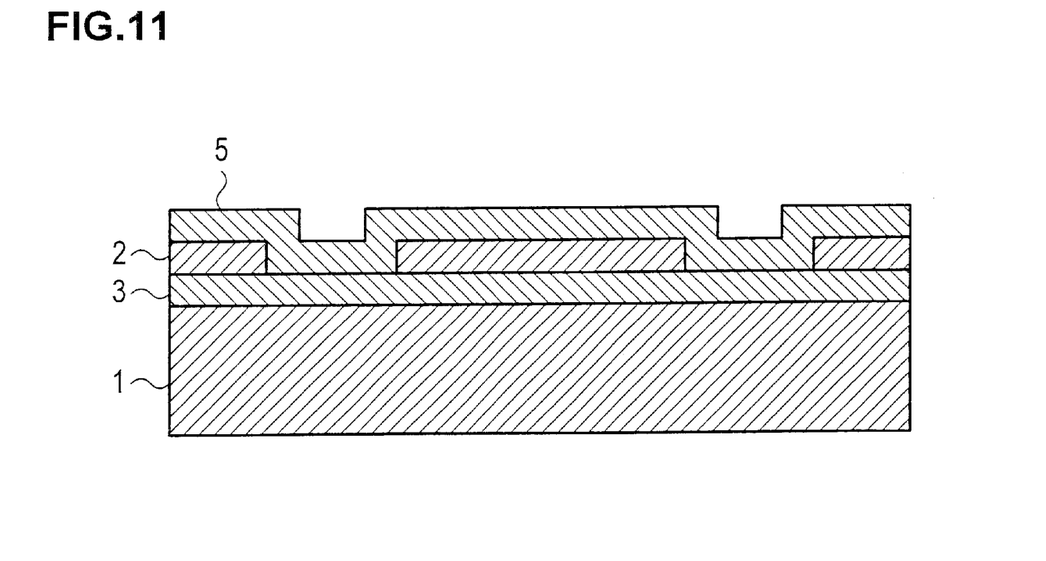
FIG. 11 is a cross section (No. 3) showing the method of fabricating a semiconductor device according to the second embodiment of the invention.

The photoresist film 4 is removed. The spacer film 5 (SiO$_2$, thickness of 0.10 $\mu$m) is formed by using CVD (FIG. 11). Not only the surface (top face) of the n$^+$ layer 2 but also the side faces of n$^+$ in a space (recess) obtained by etching the n⁺ layer 2 and the exposed surface of the channel layer 3 are also covered with the spacer film 5.

Figure 12:
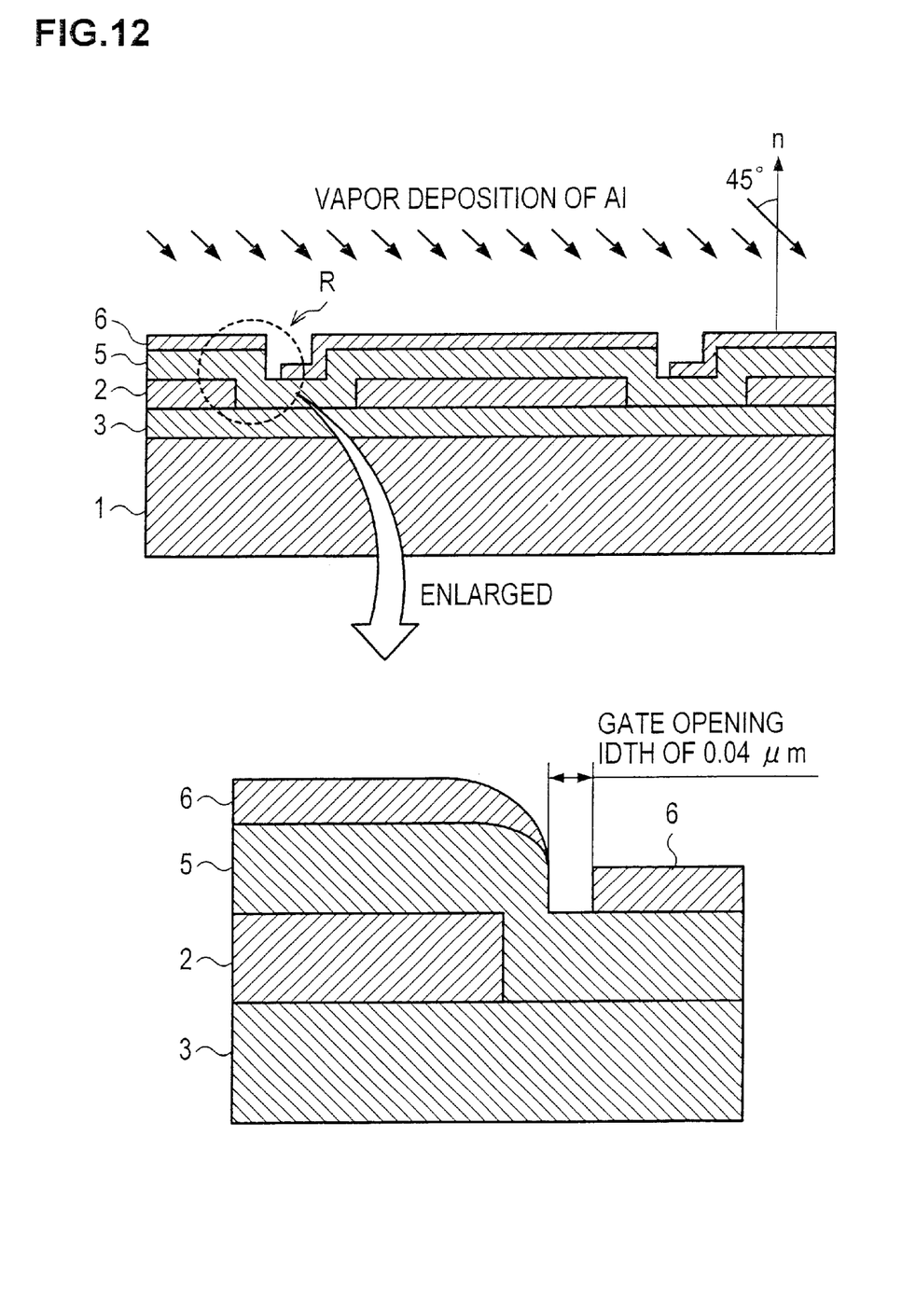
FIG. 12 is a cross section (No. 4) showing the method of fabricating a semiconductor device according to the second embodiment of the invention.

By vapor depositing Al from the direction which is inclined from the normal direction (n) of the surface of the spacer film 5 by 45° (the direction of arrows in the drawing), the metal film 6 for etching guard is formed (FIG. 12). A range in which the metal film 6 for etching guard is formed will be described by using the enlarged view of FIG. 12.

As described above, since the thickness of the n⁺ film 2 is 0.10 μm, the spacer film 5 has a step of 0.10 μm. When Al is vapor deposited on the spacer film 5 from an oblique direction, Al is shielded by the spacer film 5 and an area on which Al is not vapor deposited is obtained in the bottom face of the recess R.

When the surface (top face) of the spacer film 5 and the side face form a right angle, since the vapor deposition angle of Al is 45°, the area on which Al is not vapor deposited in the bottom face of the recess R is a range of 0.10 μm from the side face of the spacer film 5. However, since the spacer film 5 is formed by CVD and is deposited isotropically, the corner is rounded. The area on which Al is not vapor deposited in the bottom face of the recess R is therefore in a range of 0.10 μm from the side face of the spacer film 5, for example, 0.04 μm. The range in which Al is not vapor deposited (range in which a gate will be formed later) can be adjusted by the angle of vapor deposition of Al. The angle of vapor deposition of Al is determined according to the thickness of the spacer film 5, the depth of the recess R (=thickness of the n⁺ film 2), and the like.

Figure 13:
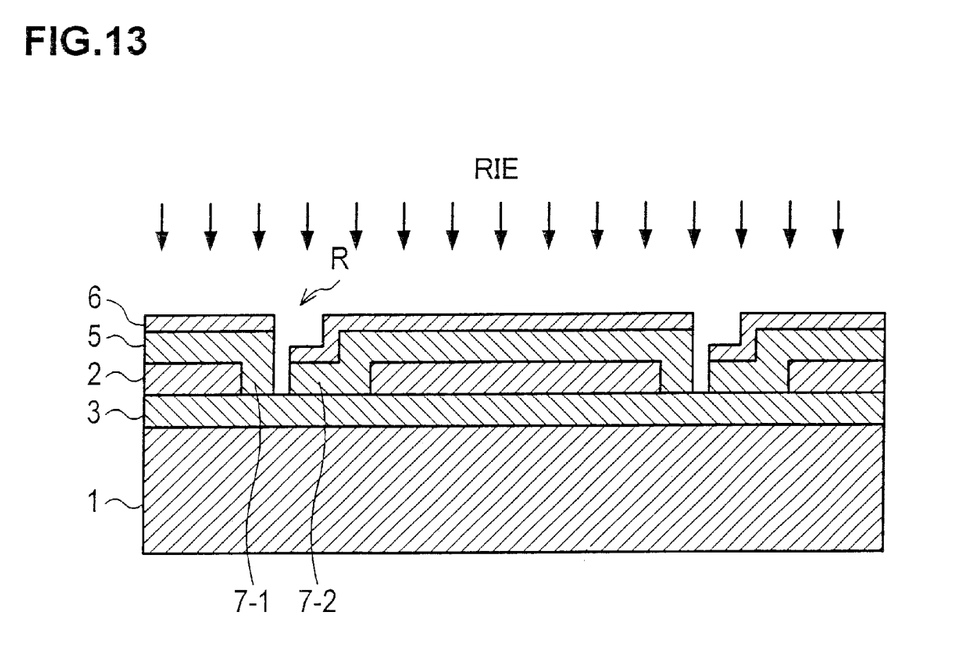
FIG. 13 is a cross section (No. 5) showing the method of fabricating a semiconductor device according to the second embodiment of the invention.

The metal film 6 for etching guard is used as a mask and anisotropic etching is performed on the spacer film 5. In this case, reactive ion etching (RIE, for example, parameters of $SF_6$ gas, 10 mtorr, 100 W) is used as anisotropic etching. By the anisotropic etching, the spacer film 5 which is not covered with the metal film 6 for etching guard at the bottom of the recess R is removed and the channel layer 3 is exposed. Since the spacer film 5 positioning under the metal film 6 for etching guard at the bottom of the recess R and the spacer film 5 covering the side face of the n⁺ layer 2 in the recess R are masked by the metal film 6 for etching guard, they remain as side walls 7-1 and 7-2 (FIG. 13).

Figure 14:
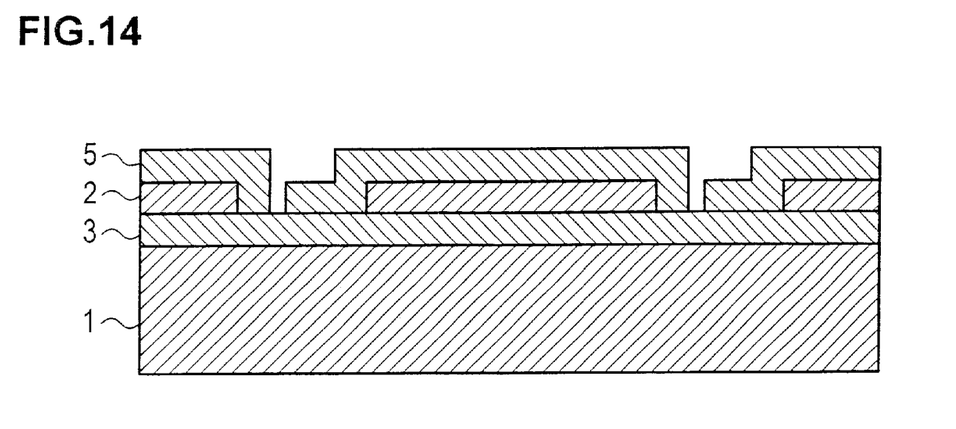
FIG. 14 is a cross section (No. 6) showing the method of fabricating a semiconductor device according to the second embodiment of the invention.

The metal film 6 for etching guard is removed by etching (FIG. 14). In this case, an etchant (for example, dilute hydrochloric acid) which reacts with Al and does not react with $SiO_2$ is used.

Figure 15:
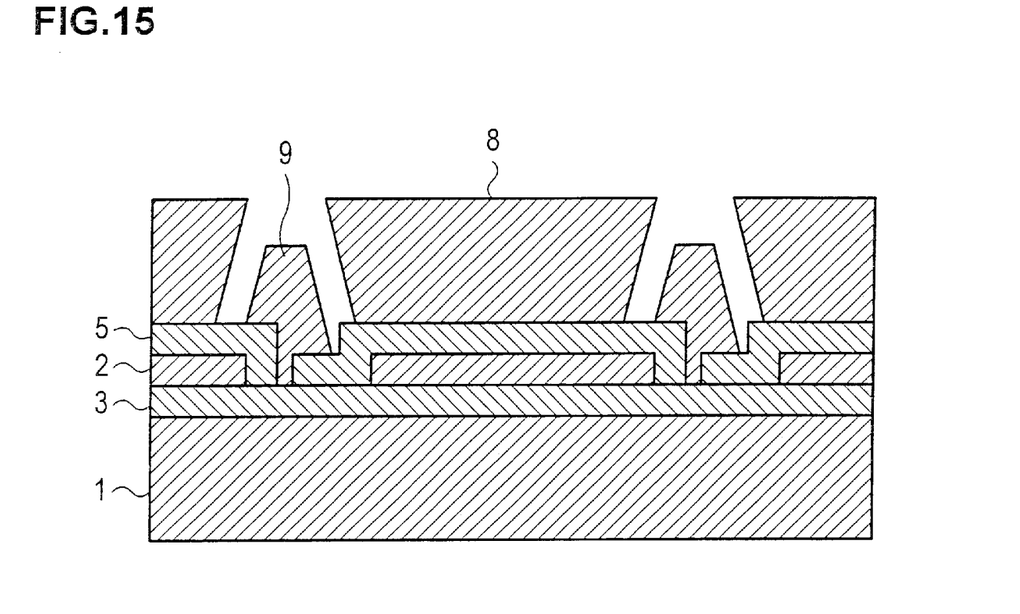
FIG. 15 is a cross section (No. 7) showing the method of fabricating a semiconductor device according to the second embodiment of the invention.

A lift-off resist is applied to form the lift-off resist film 8. The lift-off resist film 8 is patterned to form an opening having an inverted taper shape is provided in a position corresponding to the recess R. By using the opening having the inverted taper shape, the gate electrode 9 is formed (FIG. 15).

Figure 16:
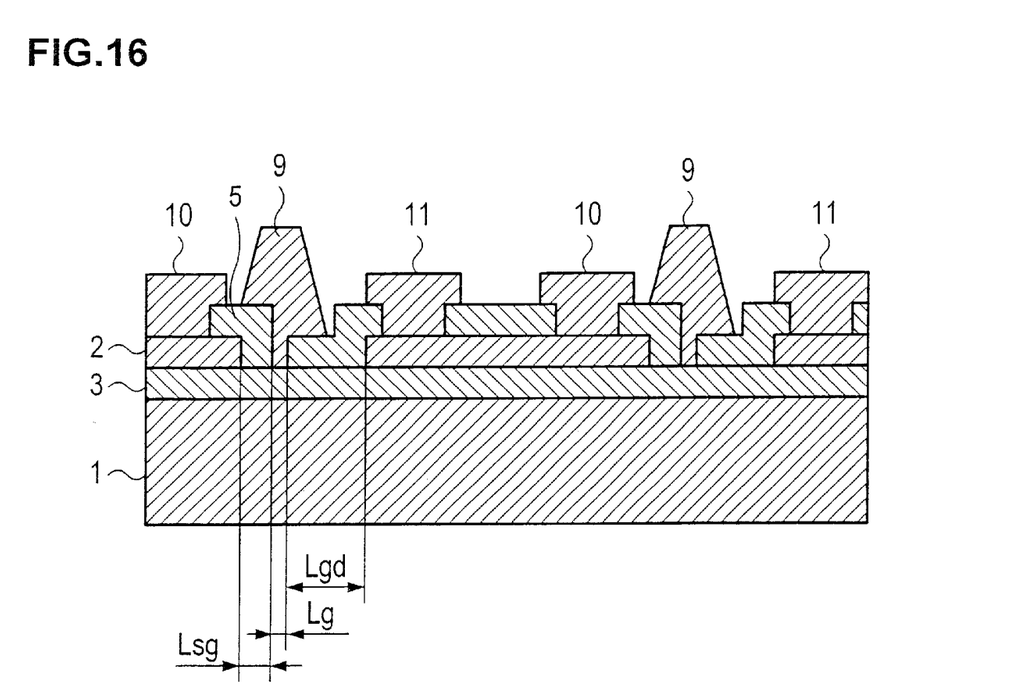
FIG. 16 is a cross section (No. 8) showing the method of fabricating a semiconductor device according to the second embodiment of the invention.

By removing predetermined two areas in the spacer film 5 per gate electrode 9, the n⁺ film 2 is exposed. Ohmic electrodes are formed in the each exposed areas and are used as the source electrode 10 and the drain electrode 11 (FIG. 16).

Through the processes, an asymmetrical self alignment gate MESFET is completed.

In the method of fabricating the semiconductor device according to the second embodiment, effects similar to those of the method of fabricating the semiconductor device according to the first embodiment can be obtained. In the method of fabricating the semiconductor device according to the second embodiment, by adjusting the angle of vapor deposition of Al, thickness of the n⁺ layer 2, and thickness of the spacer film 5, a predetermined gate length Lg can be obtained. Consequently, different from the conventional fabricating method, the MESFET having a short gate length Lg can be fabricated without depending on the performance of an exposing device. By shortening the gate length Lg, improvement in characteristics (for example, frequency characteristic and gain) of the MESFET is realized.

Further, by the method of fabricating the semiconductor device according to the second embodiment, the distance Lgd between the gate and the drain is adjusted according to the recess width (etching width of the n⁺ layer 2). The fabrication of the asymmetrical MESFET is therefore facilitated.

Third Embodiment

A method of fabricating an MESFET as a semiconductor device according to a third embodiment of the invention will be described with reference to FIGS. 17 to 26.

Figure 17:
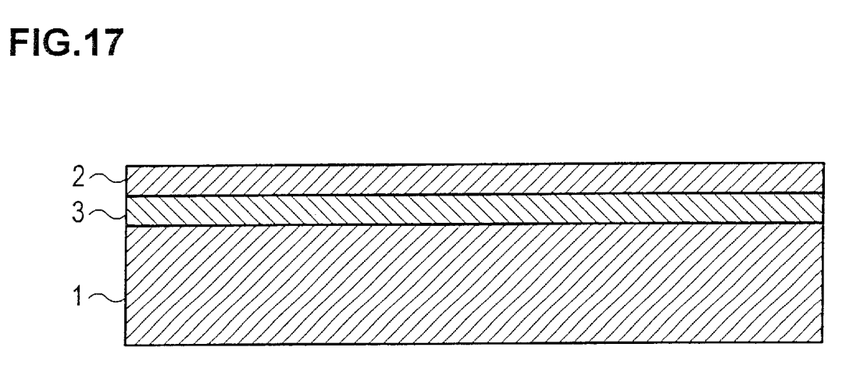
FIG. 17 is a cross section (No. 1) showing a method of fabricating a semiconductor device according to a third embodiment of the invention.

The channel layer 3 is formed on the surface of the substrate 1 and the n⁺ layer 2 (GaAs, thickness of 0.10 μm) is formed on the surface of the channel layer 3 (FIG. 17).

Figure 18:
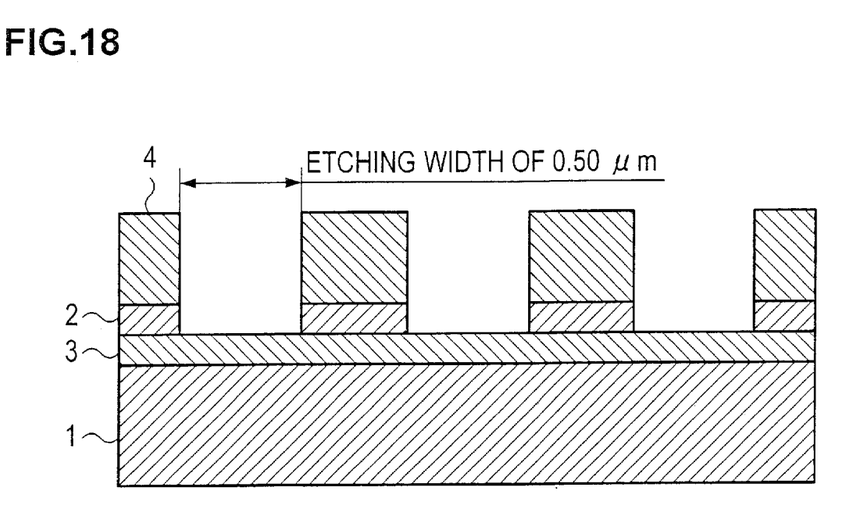
FIG. 18 is a cross section (No. 2) showing the method of fabricating a semiconductor device according to the third embodiment of the invention.

A photoresist is applied on the surface of the n⁺ layer 2, thereby forming the photoresist film 4. The photoresist film 4 is exposed and removed in a predetermined pattern and, after that, the n⁺ layer 2 is etched by using, for example, a phosphate aqueous solution to expose a part of the surface of the channel layer 3 (FIG. 18). In the following, the fabricating method in the case where the etching width (outer recess width) is 0.50 μm will be described.

Figure 19:
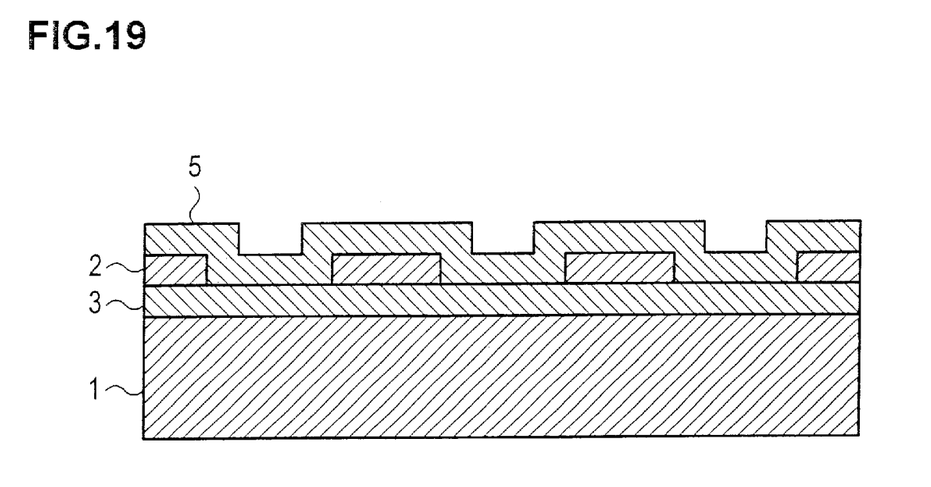
FIG. 19 a cross section (No. 3) showing the method of fabricating a semiconductor device according to the third embodiment of the invention.

The photoresist film 4 is removed. The spacer film 5 ($SiO_2$, thickness of 0.10 μm) is formed by using CVD (FIG. 19). Not only the surface (top face) of the n⁺ layer 2 but also the side faces of n⁺ in a space (recess) obtained by etching the n⁺ layer 2, and the exposed surface of the channel layer 3 are covered with the spacer film 5.

Figure 20:
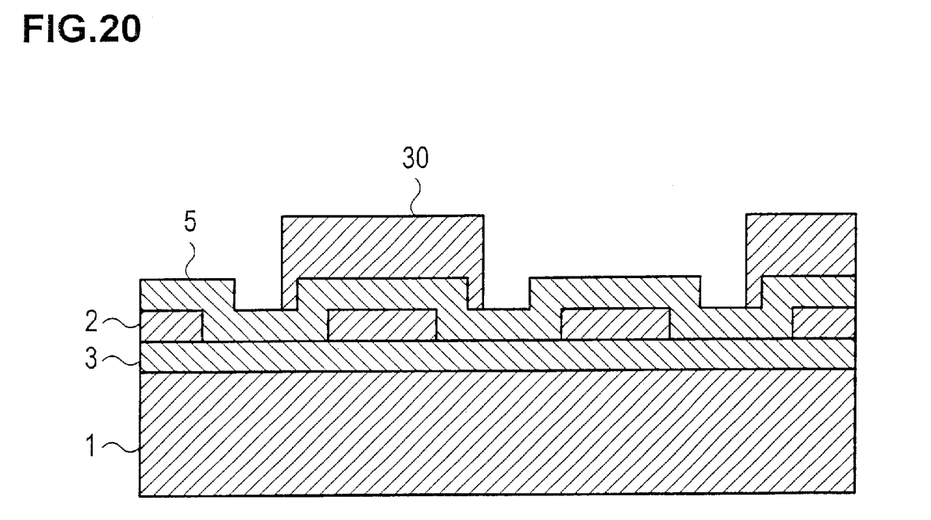
FIG. 20 is a cross section (No. 4) showing the method of fabricating a semiconductor device according to the third embodiment of the invention.

A photoresist is applied on the surface of the spacer film 5, thereby forming a photoresist film. The photoresist film is patterned in correspondence with a position in which a drain electrode will be formed later to form a photoresist film 30 for vapor deposition guard as a mask used at the time of vapor deposition of Al (FIG. 20).

Figure 21:
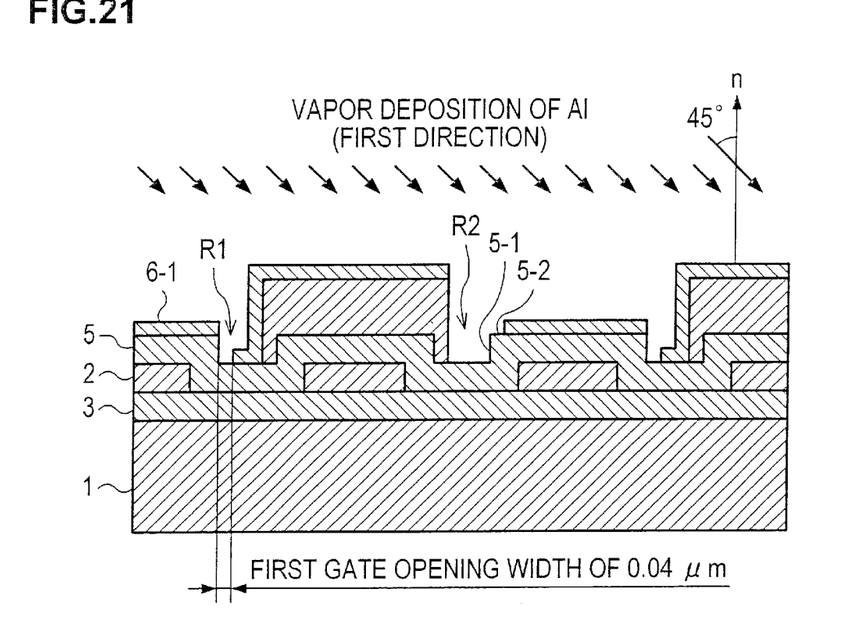
FIG. 21 is a cross section (No. 5) showing the method of fabricating a semiconductor device according to the third embodiment of the invention.

Al is vapor deposited from a first direction (direction of arrows in the drawing) which is inclined from the direction (n) of the normal line of the surface of the spacer film 5 and the surface of the photoresist film 30 for vapor deposition by 45°, thereby forming a metal film 6-1 for etching guard (FIG. 21). Next, the range in which the metal film 6-1 for etching guard is formed will now be described.

As described above, since the n⁺ film 2 has a thickness of 0.10 μm, the spacer film 5 has a step of 0.10 μm. When Al is vapor deposited on the spacer film 5 from the first direction, the area in which Al is vapor deposited and the metal film 6-1 for etching guard is formed and an area which is shielded from Al by the spacer film 5 and in which the metal film 6-1 for etching guard is not formed are obtained in the bottom face of the recess R1 in which a first gate will be formed later.

In the case where the surface (top face) of the spacer film 5 and a side face form a right angle, since the angle of vapor deposition of Al is 45°, the area in which Al is not vapor deposited in the bottom face of the recess R1 is in a range of 0.10 μm from the side face of the spacer film 5. However, since the spacer film 5 is formed by CVD and deposited isotropically, the corner portion is rounded (refer to the enlarged view of FIG. 12). The area in which Al is not vapor deposited in the bottom face of the recess R1 is therefore in the range of 0.10 μm, for example, 0.04 μm, from the side face of the spacer film 5. The range in which Al is not vapor deposited can be adjusted by the angle of vapor deposition of Al. The angle of vapor deposition of Al is determined according to the thickness of the spacer film 5, the depth of the recess R1 (=thickness of the n⁺ film 2), and the like.

On the other hand, on the bottom face of a recess R2 next to the recess R1, in which a second gate will be formed later, since the whole bottom face is shielded from Al by the photoresist film 30 for vapor deposition guard, Al is not vapor deposited and the metal film 6-1 for etching guard is not therefore formed. Since a side face 5-1 and a part 5-2 of the surface (top face) of the spacer film 5 which is continued to the bottom face of the recess R2 are also shielded from Al by the photoresist film 30 for vapor deposition guard, Al is not vapor deposited and the metal film 6-1 for etching guard is not formed.

Figure 22:
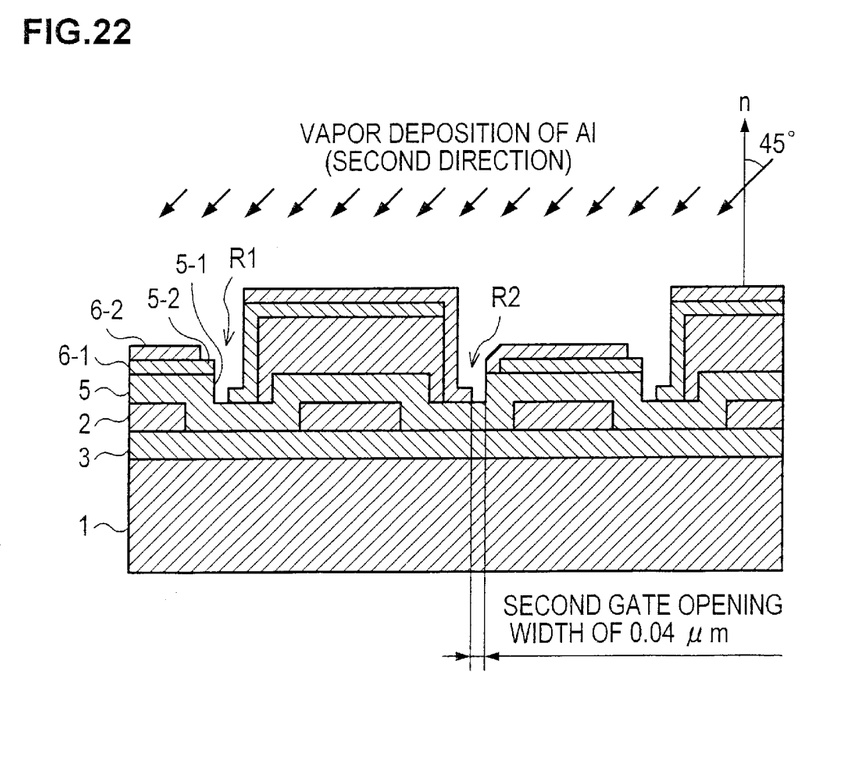
FIG. 22 is a cross section (No. 6) showing the method of fabricating a semiconductor device according to the third embodiment of the invention.

Al is vapor deposited from a second direction (direction of arrows in the drawing) which is inclined from the direction (n) of the normal line of the surface of the spacer film 5 and the photoresist film 30 for vapor deposition guard by 45°, thereby forming a metal film 6-2 for etching guard (FIG. 22). Preferably, the vapor deposition direction (first direction) of Al to form the metal film 6-1 for etching guard and the vapor deposition direction (second direction) of Al to form the metal film 6-2 for etching guard are symmetrical with respect to the direction (n) of the normal line of the surface of the spacer film 5 and the photoresist film 30 for vapor deposition guard as a reference. Next, the range in which the metal film 6-2 for etching guard is formed will now be described.

As described above, since the n⁺ film 2 has a thickness of 0.10 μm, the spacer film 5 has a step of 0.10 μm. When Al is vapor deposited on the spacer film 5 from the second direction, the area in which Al is vapor deposited and the metal film 6-2 for etching guard is formed and an area which is shielded from Al by the spacer film 5 and in which the metal film 6-2 for etching guard is not formed are obtained in the bottom face of the recess R2 in which a second gate will be formed later.

In the case where the surface (top face) of the spacer film 5 and a side face form a right angle, since the angle of vapor deposition of Al is 45°, the area in which Al is not vapor deposited in the bottom face of the recess R2 is in a range of 0.10 μm from the side face of the spacer film 5. However, since the spacer film 5 is formed by CVD and deposited isotropically, the corner portion is rounded (refer to the enlarged view of FIG. 12). The area in which Al is not vapor deposited in the bottom face of the recess R2 is therefore in a range of 0.10 μm, for example, 0.04 μm, from the side face of the spacer film 5. The range in which Al is not vapor deposited can be adjusted by the angle of vapor deposition of Al. The angle of vapor deposition of Al is determined according to the thickness of the spacer film 5, the depth of the recess R2 (=thickness of the n⁺ film 2), and the like.

On the other hand, since the whole bottom face of the recess R1 in which a first gate will be formed later is shielded from Al by the photoresist film 30 for vapor deposition guard, Al is not vapor deposited on the bottom face and the metal film 6-2 for etching guard is not therefore formed. Since the side face 5-1 and a part of the surface (top face) 5-2 of the spacer film 5 which is continued to the bottom face of the recess R1 are also shielded from Al by the photoresist film 30 for vapor deposition guard, Al is not vapor deposited and the metal film 6-2 for etching guard is not consequently formed.

Figure 23:
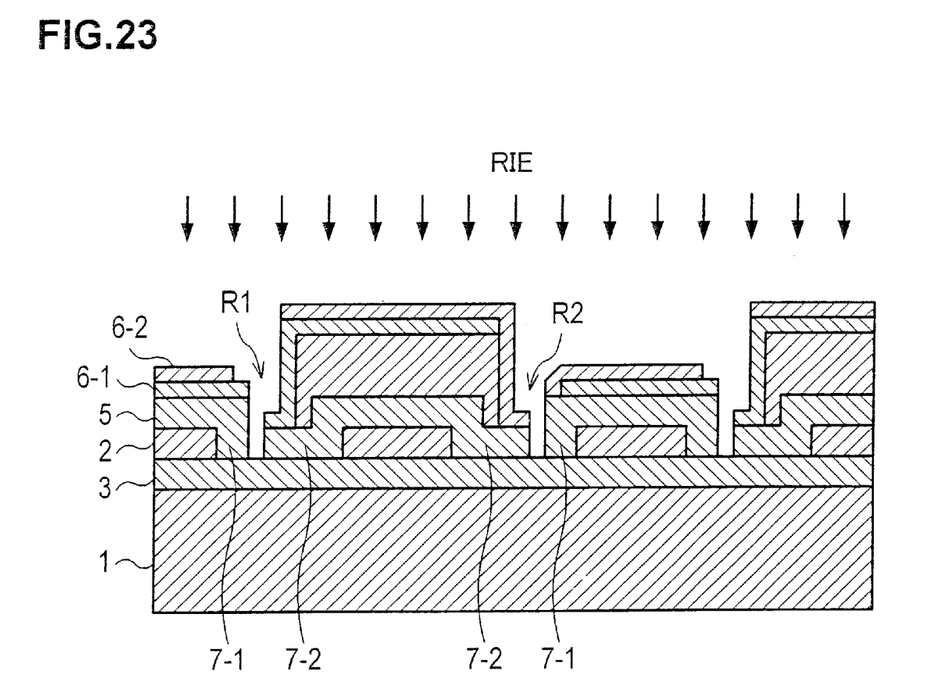
FIG. 23 is a cross section (No. 7) showing the method of fabricating a semiconductor device according to the third embodiment of the invention.

By using the metal films 6-1 and 6-2 for etching guard as a mask, anisotropic etching is performed on the spacer film 5. In this case, reactive ion etching (RIE, for example, parameters of SF₆ gas, 10 mtorr, 100 W) is used as anisotropic etching. By the anisotropic etching, the spacer film 5 which is not covered with the metal films 6-1 and 6-2 for etching guard at the bottoms of the recesses R1 and R2 is removed and the channel layer 3 is exposed. However, since the spacer film 5 positioned under the metal films 6-1 and 6-2 for etching guard at the bottoms of the recesses R1 and R2 and the spacer film 5 covering the side face of the n⁺ layer 2 in each of the recesses R1 and R2 are masked by the metal films 6-1 and 6-2 for etching guard, the spacer films 5 remain as side walls 7-1 and 7-2 (FIG. 23).

Figure 24:
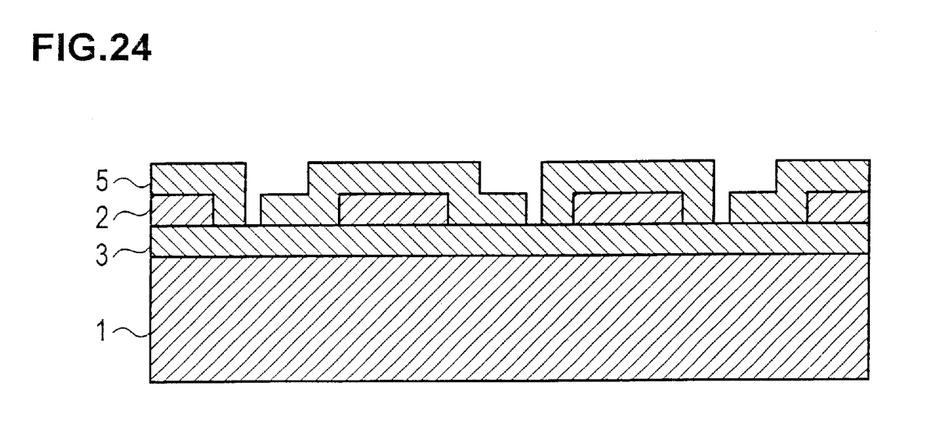
FIG. 24 is a cross section (No. 8) showing the method of fabricating a semiconductor device according to the third embodiment of the invention.

The metal films 6-1 and 6-2 for etching guard are removed by etching. In this case, an etchant (for example, dilute hydrochloric acid) which reacts with Al and does not react with SiO₂ is used. Further, the photoresist film 30 for vapor deposition guard is removed (FIG. 24).

Figure 25:
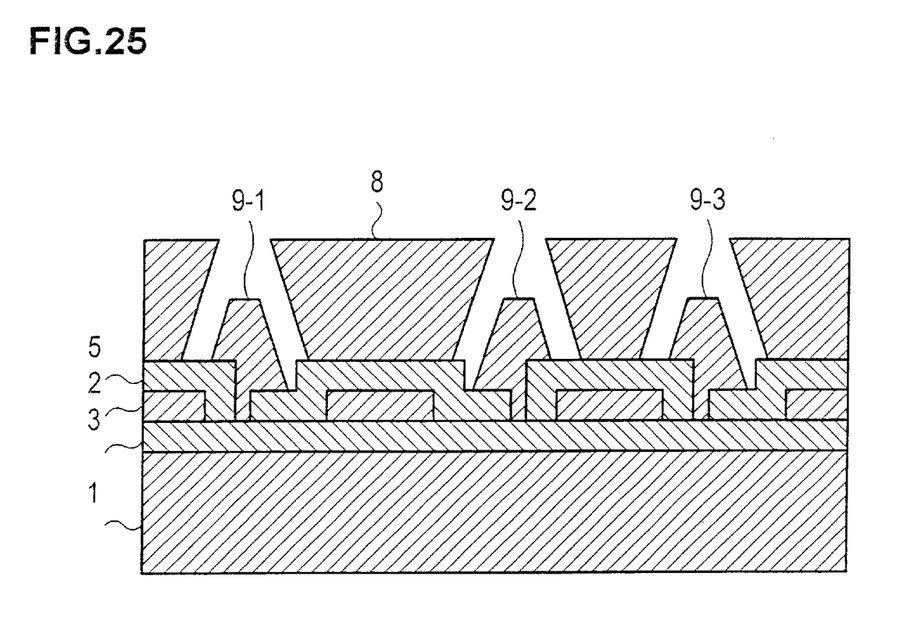
FIG. 25 is a cross section (No. 9) showing the method of fabricating a semiconductor device according to the third embodiment of the invention.

A lift-off resist is applied to form the lift-off resist film 8. The lift-off resist film 8 is patterned and openings each having an inverted taper shape are formed in positions corresponding to the recesses R1 and R2. By using the openings each having the inverted taper shape, a first gate electrode 9-1, a second gate electrode 9-2, and a third gate electrode 9-3 are formed (FIG. 25).

Figure 26:
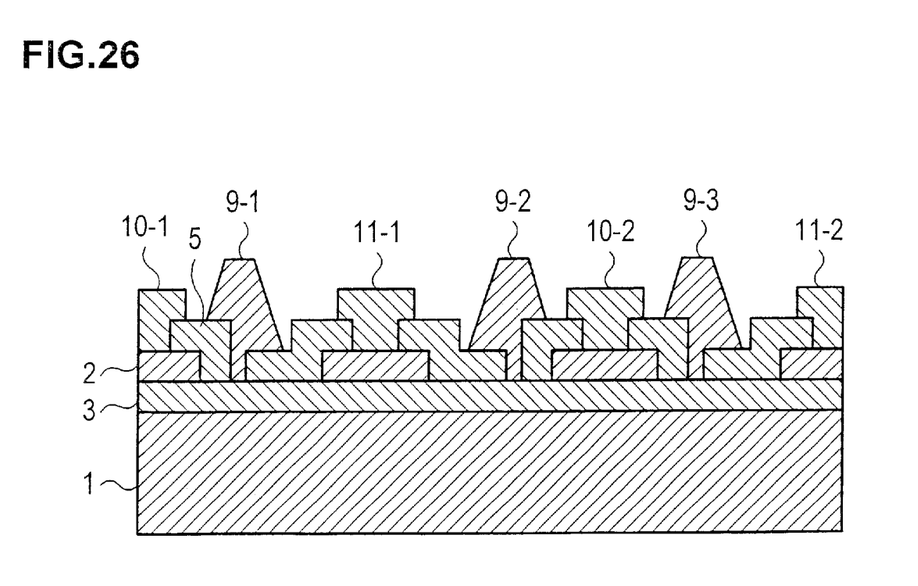
FIG. 26 is a cross section (No. 10) showing the method of fabricating a semiconductor device according to the third embodiment of the invention.

By removing a plurality of predetermined areas in the spacer film 5, the n⁺ film 2 is exposed. Ohmic electrodes are formed in the exposed areas and are alternately used as a source electrode 10-1, a drain electrode 11-1, a source electrode 10-2, and a drain electrode 11-2 (FIG. 26).

Through the processes, what is called a comb MESFET in which a source, a gate, a drain, a gate, a source, . . . are continued is completed.

In the method of fabricating the semiconductor device according to the embodiment, effects similar to those of the methods of fabricating a semiconductor device according to the first and second embodiments are produced.

In the method of fabricating a semiconductor device according to the third embodiment, since the photoresist film 30 for vapor deposition guard is formed, the area in which Al is not vapor deposited at the time of vapor depositing Al from an oblique direction can be assured. By commonly using the drain electrode by a plurality of neighboring FETs, the fabrication of the comb FET realizing reduction in circuit scale is facilitated.

Although the preferred embodiments of the invention have been described with reference to the appended drawings, the invention is not limited to the embodiments. It is obvious for a person skilled in the art that various changes and modifications are possible within the scope of technical ideas as set out in the claims. It is to be understood that the changes and modifications naturally belong to the technical field of the invention.

As described above, according to the invention, without depending on the performance of an exposing device, the pattern in the semiconductor device can be formed more finely and more variously. The distance between patterns can be adjusted with high accuracy while preventing short-circuiting between the patterns.

What is claimed is:

1. A method of fabricating a semiconductor device, comprising:

forming a first layer on a substrate;

forming a second layer on said first layer;

forming a recess from which said first layer is exposed by removing a part of said second layer;

forming an insulating film covering a surface of said second layer, and an inner wall face and a bottom face of said recess;

forming a mask by depositing a material different than said insulating film onto said insulating film from a direction which forms a predetermined angle with a direction of a normal line of a surface of said insulating film;

performing anisotropic etching on said insulating film exposed from said mask from the direction of a normal line of a surface of said mask, to expose a part of the first layer;

removing said mask; and forming a gate electrode on the first layer exposed in the recess.

2. The method of fabricating a semiconductor device according to claim 1, wherein an opening width and a depth of said recess after said insulating film is formed are W and D, respectively, said predetermined angle during said forming a mask is adjusted to a value larger than α, wherein α=tan$^{-1}$ (W/D).

3. The method of fabricating a semiconductor device according to claim 1, wherein an opening width and a depth of said recess after said insulating film is formed are W and D, respectively, said predetermined angle during said forming a mask is adjusted to a value smaller than a and larger than zero, wherein α=tan$^{-1}$ (W/D).

4. The method of fabricating a semiconductor device according to claim 1, wherein said semiconductor device is an Field Effect Transistor, a channel region is formed in said first layer, and a drain region and a source region are formed in said second layer.

5. The method of fabricating a semiconductor device according to claim 1, wherein said insulating film is made of $SiO_2$ and said mask is made of Al.

6. The method of fabricating a semiconductor device according to claim 1, wherein said anisotropic etching is reactive ion etching.

7. A method of fabricating a semiconductor device, comprising:

forming a first layer on a substrate;

forming a second layer on said first layer;

forming a first recess and a second recess from which said first layer is exposed by removing a part and another part of said second layer;

forming an insulating film covering a surface of said second layer, and an inner wall face and a bottom face of each of said first recess and said second recess;

forming a first mask on said insulating film positioned between said first recess and said second recess;

forming a second mask by depositing a material different than said insulating film onto said insulating film and said first mask from a first direction which forms a predetermined first angle with a direction of a normal line of a surface of said insulating film;

forming a third mask by depositing a material different than said insulating film onto said insulating film and said first mask from a second direction which forms a predetermined second angle with the direction of the normal line of the surface of said insulating film;

performing anisotropic etching on said insulating film exposed from said second mask and said third mask from a direction of a normal line of surfaces of said second and third masks, to expose a part of the first layer;

removing said first, second, and third masks; and forming gate electrodes on the first layer exposed in the first and second recesses.

8. The method of fabricating a semiconductor device according to claim 7, wherein said semiconductor device is an FET (Field Effect Transistor), a channel region is formed in said first layer, and a drain region and a source region are formed in said second layer.

9. The method of fabricating a semiconductor device according to claim 7, wherein said insulating film is made of $SiO_2$ and said second and third masks are made of Al.

10. The method of fabricating a semiconductor device according to claim 7, wherein said anisotropic etching is reactive ion etching.

11. The method of fabricating a semiconductor device according to claim 7, wherein said first mask is a photoresist film.

* * * * *